United States Patent [19]

Salesky et al.

[11] 4,005,373

[45] Jan. 25, 1977

[54] TRANSIENT ELIMINATION CIRCUIT

[75] Inventors: Emery Salesky, Denville; Kent W. Luehman, Parsippany, both of N.J.

[73] Assignee: Hewlett-Packard Company, Palo Alto, Calif.

[22] Filed: Apr. 14, 1976

[21] Appl. No.: 676,847

[52] U.S. Cl. .................. 330/51; 330/86; 330/207 P

[51] Int. Cl.² .......................... H03F 1/14

[58] Field of Search .......... 330/30 D, 51, 86, 207 P

[56] References Cited

UNITED STATES PATENTS

| | | | |
|---|---|---|---|
| 3,378,779 | 4/1968 | Priddy | 330/30 D X |
| 3,586,989 | 6/1971 | Wheable | 330/51 |
| 3,588,729 | 6/1971 | Satterfield | 330/207 P |

*Primary Examiner*—R. V. Rolinec
*Assistant Examiner*—Lawrence J. Dahl

[57] ABSTRACT

One junction field effect transistor is connected in shunt with an operational amplifier so as to render its gain zero when no voltage is applied to its gate and another junction field effect transistor is connected so as to shunt the output of the amplifier to ground when no voltage is applied to its gate.

2 Claims, 1 Drawing Figure

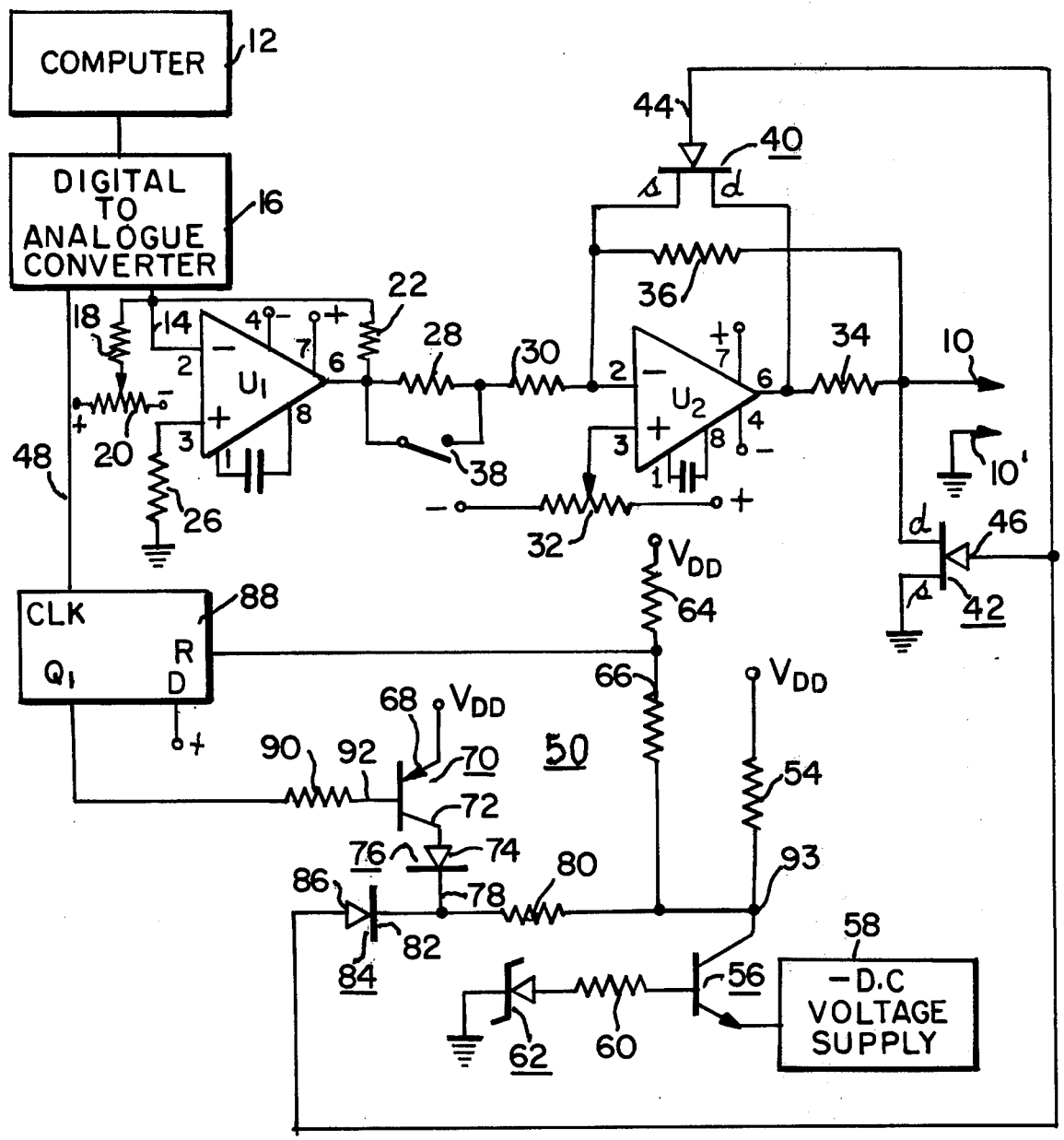

TRANSIENT ELIMINATION CIRCUIT

BACKGROUND OF THE INVENTION

In applying voltages to voltage sensitive loads care must be taken that transients do not occur, especially when instrument power is being turned on or off. For example, when the output of a direct current power supply is to be varied in accordance with a computer program, the digital output of the computer is converted into an analogue voltage by a digital to analogue converter and applied, after amplification, so as to vary the reference voltage of the power supply. When power is turned on or off, the amplifier can provide transients of high amplitude that would cause the power supply to deliver dangerous voltages or currents to a load connected thereto. At the instant the instrumentation is turned on, it is also possible that the computer output or the output of the digital to analogue converter can have a value that would cause the voltage output of the power supply to damage the load which it is driving.

SUMMARY OF THE INVENTION

After a suitable control current is formed, it is converted to a voltage and amplified before application to the power supply. In accordance with this invention the output of the amplifier is held to an extremely low value from the instant the circuits are energized until conditions permit the use of the full voltage. This is accomplished by connecting one junction field effect transistor between the input and output of the amplifier so as to make its gain nearly zero when no voltage is applied to its gate, a situation that occurs when the equipment is turned on, and by connecting another junction field effect transistor so as to shunt the output of the amplifier under the same conditions. Circuits are provided for turning the field effect transistor off when conditions permit.

DESCRIPTION OF PREFERRED EMBODIMENT

The drawing illustrates the application of the invention to a system for controlling the output voltage at terminals 10 and 10' in accordance with the programmed output of a computer 12. The digital output of the computer 12 is translated into an analogue current in a lead 14 by a digital to analogue converter 16. An integrated circuit operational amplifier $U_1$, type 301A, converts the current applied to its negative input terminal 2 into a corresponding voltage at its output terminal 6. The gain of the amplifier $U_1$ is determined by a resistor 10 connected between the output terminal 6 and the input. Any off-set that may be required by the power supply to be connected to the output terminals 10, 10' is provided in part by connection of the terminal 2 of $U_1$ to a source voltage that may be varied from positive to negative values. In particular, the terminal 2 of $U_1$ is connected via a resistor 18 to the tap of a potentiometer 20 that is connected between a point of positive potential and a point of negative potential. The positive input 3 of $U_1$ is connected to ground by a resistor 26.

The output terminal 6 of $U_1$ is connected via series resistors 28 and 30 to the negative input terminal 2 of an integrated circuit operational amplifier, type 308. The positive input of $U_2$ is connected to a tap of a potentiometer 32 so as to have a positive or negative voltage applied thereto in order to cooperate with the resistor 20 in providing any offset that may be required by the power supply.

A decoupling resistor 34 is connected between the output terminal 6 of $U_2$ and the output terminal 10 of the system, and a feedback resistor 36 is connected between the output end of the resistor 34 and the negative input terminal 2 of $U_2$. Suitable operating potentials from sources not shown are applied to the terminals 4 and 7 of $U_1$ and $U_2$.

It will be apparent to those skilled in the art that in the circuit thus far described the gain of the amplifier $U_2$ at the ouput terminal 10 is determined by the ratio of the resistance of the resistor 36 to the sum of the resistances of the resistors 28 and 30. Therefore, the maximum voltage between the output terminals 10, 10' can be increased by closing a range switch 38 that shunts the resistor 28.

In accordance with the invention a junction field effect transistor 40 is connected with its source to drain path between the input terminal 2 of $U_2$ and its output terminal 6. Further, in accordance with the invention, another junction field effect transistor 42 is connected with its drain to source path between the output end of the resistor 34 and ground. It is important to note that no voltage need be applied to the gates 44 and 46 of the transistors 40 and 42, in order for the resistance between their respective sources and drains to be very nearly zero. Under this condition the feedback resistance between the output terminal 6 of $U_2$ and its input terminal 2 is nearly zero and the gain of $U_2$ with respect to terminal 6 is nearly zero. As will be explained when the equipment is turned on no operating potentials are applied to the gates 44 and 46 so that the output voltage between the output terminals 10 and 10' is very nearly zero regardless of the analogue current that might flow out of the converter 16 as a result of previous history or any transient voltage at the output terminal 6 of $U_1$.

However, an output voltage between the terminals 10 and 10' of very nearly zero is not good enough for many applications and, in fact, it may be desirable to keep the voltage less than 0.1 volt. Furthermore, $U_2$ may develop transients that would not be affected by the gain of $U_2$ and therefore not affected by the action of the field effect transistor 40. When the gate to source voltage of the junction field effect transistor 42 is zero, the resistance between its source and drain is very low. This resistance in combination with the resistor 34 forms a voltage divider that greatly reduces any small output voltage that might appear at the output terminal 6 of $U_2$ due to transients of either polarity that might occur in $U_2$ due to turn-on or turn-off.

It is therefore apparent that some means must be provided for controlling the state of conduction of the field effect transistors 40 and 42 whenever it is safe to do so. It is well known by those skilled in the art that digital to analogue converters are equiped with registers for storing the various words of information supplied by a computer and that signal voltages or currents may be derived in various ways to indicate that all the words have been received. The presence of these signals means that the output of the converter 16 will then be that called for by the programming in the computer. The signal may be a voltage applied to lead 48 that is connected to the clock terminal CK of an integrated circuit type 4015.

The following circuit, generally indicated by the numeral 50, is merely one of many means that may be used for biasing the gates 44 and 46 of the field effect transistors 40 and 42. For the desired state of conduction as a function of the signal 48 a positive voltage $V_{dd}$ derived from any suitable means such as the power supply of the converter 16 is made available at various points. A resistor 54 and the collector emitter path of a transistor 56 are connected in series between a point of positive voltage $V_{dd}$ and a supply 58 of negative voltage that is also available from the power supplies of the converter 16. The base of the transistor 56 is connected to ground via a resistor 60 and a zener diode 62. Series resistors 64 and 66 are connected from a point of voltage $V_{dd}$ in parallel with the resistor 54. The emitter 68 of a transistor 70 is connected to a point of positive voltage $V_{dd}$ and the collector 72 is connected to the anode 74 of a diode 76, The cathode 7B of the diode 76 is connected to one end of a resistor 80, the other end being connected to the collector of the transistor 56. The cathode 82 of a diode 84 is connected to the cathode 78 of the diode 76 and its anode 86 is connected to the gates 44 and 46 of the junction field effect transistors 40 and 42. An integrated circuit 88, type 4015 has its clock terminal CK connected to the lead 48, its reset terminal R connected to the junction of the resistors 64, 66 and its $Q_1$ terminal connected via a resistor 90 to the base electrode 92 of the transistor 70.

The operation of the circuit 50 is as follows. At the instant the converter 16 is turned on, the transistor 56 is not conducting, and the voltage applied to the terminal R of the integrated circuit is $V_{dd}$. This causes the voltage at $Q_1$ to be low so as to cause conduction in the transistor 70. This forces the diode 84 to be back biased. As a result, the gates 44 and 46 float and their source-drain paths continue to conduct heavily and therefore appear as a near short circuit.

After a very brief period of time, the negative voltage supplied by the power supply 58 builds up to a point where the transistor 56 conducts, thus making the voltage at the junction 93 of the resistors 54, 66 and 80 negative. Current now flows through the transistor 70 and the resistor 80 so as to keep the diode 84 back biased. The voltage supplied by the converter 16 on the lead 48 turns off the FETs in the following manner. The voltage is in the form of a positive pulse which when applied to the clock terminal CK of the integrated circuit 88 causes $Q_1$ and the base 92 of the transistor 70 to have a steady positive potential that cuts off the transistor 70. When this occurs, the negative voltage from the point 58 is applied via the diode 84 to the gates 44 and 46, thus turning of the field effect transistors 40 and 42.

When power to the instrument is turned off, the negative voltage from the supply 58 goes in a positive direction until the transistor 56 no longer conducts. The voltage at the junction 93 rises to a positive bias value, $V_{dd}$, and its application to the terminal R resets the integrated circuit 88. $Q_1$ provides a low voltage and the transistor 70 conducts again so as to back bias the diode 84 as before and permit the gates 44 and 46 to float and the source-drain paths of the field effect transistor 40, 42 to conduct heavily once again and act like short circuits. The circuit 50 is then a means for letting the gates 44 and 46 float for a time after the power is turned on until a signal is received that is indicative of the fact that the digital to analogue converter is ready to apply appropriate signals to the amplifier. The use of FETs 44 and 46 in the manner described makes it unnecessary for the circuit 50 to perform any function to prevent undesired transients at the output terminals 10, 10'. This is because the FETs 40 and 42 are in a condition of full conduction without any voltage being applied to their respective gates 44 and 46. This means that the amplifier system is fail safe. It is only necessary that the circuit 50 turn off the FETs 40 and 42 at the time described.

It is important that the devices 40, 42 exhibit an extremely low resistance when no voltage is applied to their control electrode, and therefore other devices such as a depletion mode MOSFET could be used.

What is claimed is:

1. In a direct current amplifier comprising in combination a first operational amplifier having at least one input and an output, a second operational amplifier having an inverting input, a non-inverting input and an output, means providing a direct current path having a predetermined resistance between the output of said first operational amplifier and the said inverting input of said second operational amplifier, a first output terminal, a first resistor connected between said output of said second operational amplifier and said output terminal, a second resistor connected between said inverting input terminal of said second operational amplifier and said output terminal, a first junction field effect transistor having source, drain and gate electrodes, said source electrode being connected to said inverting input of said second operational amplifier and said drain electrode being connected to said output of said second operational amplifier, a source of reference potential, a second output terminal connected to said source, a second junction field effect transistor having source drain and gate electrodes, said source electrode being connected to said first output terminal and said drain electrode being connected to said second output terminal, circuit means having an input and an output, a direct current connection between said output and said first and second gate electrodes, said circuit means responding to a given voltage at its input to produce zero volts at its output and responding to a different voltage at its input to produce a voltage other than zero at its output.

2. An amplifier that provides nearly zero gain when the power is turned on so as to greatly attenuate any transient noise that might be present at its input and which also attenuates transients that it produces at its output when the power is turned on comprising in combination an operational amplifier having a positive input, a negative input and an output, means establishing an operating bias at said positive input, resistor means connected at one end to said negative input, the other end being adapted for connection to a signal source that may have undesired transients, first and second output terminals, a voltage dividing resistor connected between said first output terminal and said output of said operational amplifier, a gain determining resistor connected between said negative input and said output terminal, a first junction field effect transistor having its source to drain path connected between said negative input and said output of said operational amplifier, means establishing said second output terminal at a reference potential, a second junction field effect transistor having its source-drain path connected between said first and second output terminals, a switching circuit, a diode connected between said switching circuit and the gate electrodes of said transistors, said switching circuit providing a back bias to said diode so that said gate electrodes float, said circuit causing said diode to conduct a predetermined time after power is applied to said source, said circuit and said operational amplifier whereby a cut-off bias voltage is applied to the gate electrodes of said field effect transistors.

* * * * *

UNITED STATES PATENT AND TRADEMARK OFFICE
CERTIFICATE OF CORRECTION

PATENT NO. : 4,005,373

DATED : January 25, 1977

INVENTOR(S) : Emery Salesky and Kent W. Luehman

It is certified that error appears in the above-identified patent and that said Letters Patent are hereby corrected as shown below:

Column 2, line 31, "explained when" should read --explained, when--.
Column 2, line 57, "eauiped" should read --equipped--.
Column 3, line 16, "76," should read --76.--
Column 3, line 49, "turning of" should read --turning off--.
Column 3, line 60, "effect transistor" should read --effect transistors--.

Signed and Sealed this

Seventh Day of June 1977

[SEAL]

Attest:

RUTH C. MASON
Attesting Officer

C. MARSHALL DANN
Commissioner of Patents and Trademarks